(12) United States Patent
Dai et al.

(10) Patent No.: US 6,339,347 B1
(45) Date of Patent: Jan. 15, 2002

(54) METHOD AND APPARATUS FOR RATIOED LOGIC STRUCTURE THAT USES ZERO OR NEGATIVE THRESHOLD VOLTAGE

(75) Inventors: Kevin Dai, Fremont, CA (US); Terry Chappell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/539,515

(22) Filed: Mar. 30, 2000

(51) Int. Cl.[7] .................................. H03K 19/094
(52) U.S. Cl. .................... 326/119; 326/36; 326/17; 326/120
(58) Field of Search .................. 326/17, 87, 112, 326/119, 120, 121, 36

(56) References Cited

U.S. PATENT DOCUMENTS

| | | | |
|---|---|---|---|
| 3,935,474 A | 1/1976 | Komarek | |
| 4,143,362 A | 3/1979 | Ulmer | |
| 4,207,616 A | 6/1980 | Heeren | |
| 4,256,974 A | 3/1981 | Padgett et al. | |
| 4,463,273 A | * 7/1984 | Dingwall | ............... 307/450 |
| 4,473,760 A | 9/1984 | Ambrosius, III et al. | |
| 4,503,341 A | * 3/1985 | Shah | ............... 307/450 |
| 4,896,057 A | 1/1990 | Yang et al. | |
| 5,157,630 A | 10/1992 | Suwa et al. | |
| 5,256,916 A | 10/1993 | Thurston | |
| 5,285,069 A | 2/1994 | Kaibara et al. | |
| 5,418,473 A | 5/1995 | Canaris | |
| 5,422,523 A | 6/1995 | Roberts et al. | |
| 5,572,150 A | 11/1996 | Kartschoke et al. | |
| 5,659,513 A | 8/1997 | Hirose et al. | |
| 5,831,990 A | 11/1998 | Queen et al. | |
| 5,841,299 A | 11/1998 | De | |
| 5,872,027 A | 2/1999 | Mizuno | |
| 5,880,604 A | 3/1999 | Kawahara et al. | |
| 5,880,967 A | 3/1999 | Jyu et al. | |
| 5,892,372 A | 4/1999 | Ciraula et al. | |
| 5,901,079 A | 5/1999 | Chiu et al. | |
| 5,926,050 A | 7/1999 | Proebsting | |
| 5,942,917 A | 8/1999 | Chappell et al. | |
| 5,986,476 A | 11/1999 | De | |
| 6,078,195 A | * 6/2000 | Chen | ............... 326/121 |
| 6,137,318 A | * 10/2000 | Takaaki | ............... 326/112 |

* cited by examiner

Primary Examiner—Michael Tokar
(74) Attorney, Agent, or Firm—Kenyon & Kenyon

(57) ABSTRACT

A method and apparatus provides an efficient ratioed digital logic structure. The digital logic structure includes ratioed pull-up transistors and pull-down transistors such that the circuit noise margin does not substantially affect gain performance of the ratio stage. In one particular embodiment, a ratioed logic structure includes PMOS transistors and NMOS transistors that receive input voltage signals wherein a current path is induced in the NMOS transistors when a voltage input of zero or less is applied. Another feature of the present invention allows modification of gain performance of the ratio stage by arranging different ratios of the PMOS-to-NMOS transistor channel widths.

20 Claims, 2 Drawing Sheets

METHOD AND APPARATUS FOR RATIOED LOGIC STRUCTURE THAT USES ZERO OR NEGATIVE THRESHOLD VOLTAGE

BACKGROUND OF THE INVENTION

1. Field of the Invention

The present invention relates generally to metal oxide semiconductor (MOS) transistors. It particularly relates to digital circuits involving MOS transistors that use ratioed logic.

2. Background Art

Metal Oxide Semiconductor (MOS) transistors have become very useful in digital circuit applications, particularly very-large-scale integrated circuits (VLSI) such as microprocessors and memories due to their small size, high switching speed, and ease of fabrication. Transistors are vital to microprocessor development since a typical microprocessor includes millions of transistors in its digital circuitry. The Intel Pentium® II processor and the IBM® POWER PC are illustrative examples of these high-end microprocessors.

Complementary MOS (CMOS) uses both P-channel and N-channel MOS transistors in its circuits. An important CMOS circuit, due to its advantageous characteristics, is the CMOS inverter. The circuit representation for a CMOS inverter 200 is shown in FIG. 1. CMOS inverter 200 typically includes PMOS transistor 210 coupled source-to-drain between a first node 205 and an output node 240. CMOS inverter 200 also typically includes NMOS transistor 220 coupled drain-to-source between the output node 240 and a second node 208 and further includes an input node 230 coupled to the gate of each transistor. Typically, the first node 205 is a positive voltage supply (e.g., $V_{dd}$) and the second node 208 is ground. PMOS transistor 210 and NMOS transistor 220 effectively form at least two switchable conductive paths that either create a connection to the next coupled node when the transistor is active (turned on) or create an open circuit when the transistor is inactive (turned off). The circuit is aptly named an inverter for when an input signal I applied to input node 230 is in a high state (e.g., logic level "1"), PMOS transistor 210 is off and the output node 240 is pulled low (e.g., logic level "0") since the output node 240 is coupled to ground through the active NMOS transistor. Conversely, the output node 240 is pulled high (e.g., logic level "1") when an input signal I applied to input node 230 is in a low state (e.g., logic level "0") since the output node 240 is coupled to the positive voltage through the active PMOS transistor. In this particular circuit arrangement, PMOS transistors are commonly referred to "Pull-up" transistors and NMOS transistors are referred to "Pull-down" transistors due to their particular connection paths to a positive voltage and ground, respectively.

For higher switching speeds and to increase circuit performance, dynamic logic structures such as domino logic or ratioed logic have been used. Ratioed logic describes a CMOS circuit typically comprising a plurality of PMOS and NMOS transistors wherein the PMOS transistor and the NMOS transistor are contending with each other on a particular node when any one or more of the NMOS transistors are on. Consequently, ratioed CMOS circuitry depends strongly on the relative geometric sizes (particularly channel widths) of the PMOS and NMOS transistors. Conversely, ratioless logic designs have circuit characteristics (e.g., voltage transfer) that do not depend strongly on the relative geometric sizes of the PMOS and NMOS transistors.

The CMOS inverter structure is also commonly used in ratioed logic. The circuit speed of the CMOS inverter is the speed with which the PMOS and NMOS transistors of a CMOS inverter can respectively pull the output node toward one voltage or another (e.g., delay of the inverter) and is directly related to the size of the two transistors (e.g., driving and driven transistor). This competing relationship is often related to the ratio of the size of the channel widths of the PMOS transistor to that of the NMOS transistor. In a multiple stage CMOS logic structure, the PMOS and NMOS transistors are sized (via respective channel widths) such that any one NMOS transistor can drive the output to ground for one or two active PMOS transistors. Typically, in ratioed CMOS circuitry, this ratio of PMOS-to-NMOS transistor channel widths ($W_p/W_n$) is also carefully chosen to determine the respective on-resistances and threshold voltages (turn-on voltage) which will advantageously affect the transition delay and switching speeds of these devices. The advantages of ratioed logic include increased switching speed, compact physical layout characteristic, reduction in propagation delay, and other advantages.

Despite these advantages, there still remain problems with ratioed logic design which include power consumption, noise margin, and easily scaleable ratio stage gain. Therefore, there is a need to employ digital circuit designs using ratioed logic that help solve these problems.

DETAILED DESCRIPTION

Embodiments of the present invention use MOS transistors to provided logic design that can be advantageously applied to microprocessor applications. Therefore, it is noted that particular non-critical aspects of MOS technology are not described in great detail as they are not critical to the present invention and these as are well-known in the relevant field of invention.

Figure 1:
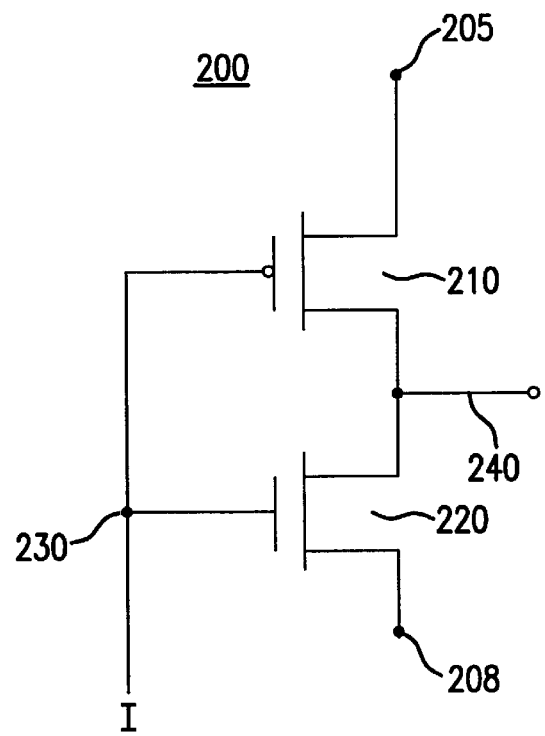
FIG. 1 is a circuit diagram of a CMOS inverter
Figure 2:
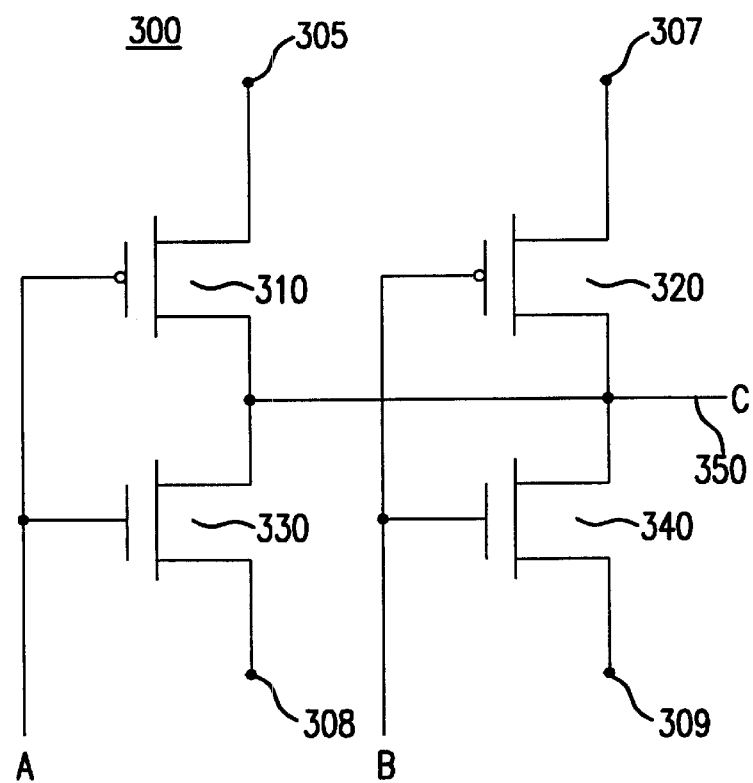
FIG. 2 is an illustrative embodiment of the present invention showing a CMOS circuit design

FIG. 2 is an embodiment of a digital logic structure 300 using MOS transistors according to an embodiment. A data path is formed by a plurality of cascaded CMOS inverters. It is noted that a two-stage CMOS logic structure is shown, but embodiments of the present invention are not limited to this particular number of cascaded CMOS inverters. The CMOS circuit 300 operates to communicate periodic digital pulsed input signals provided by signal sources A, B to an output node 350 with output signal C. Preferably, the input signals A, B are active-low, standby-high, pulsed signals having positive and negative-going state transitions.

The CMOS circuit 300 may comprise PMOS transistors 310, 320 coupled source-to-drain between a first node 305, 307 and output node 350. CMOS circuit 300 may further include NMOS transistors 330, 340 coupled drain-to-source between output node 350 and a second node 308, 309.

The PMOS transistors 310, 320 coupled as shown form switchable conductive paths between the first node 305, 307 and the output node 350. This particular coupling arrangement enables a conductive path between output node 350 and the first node 305, 307 that can be switched on and off (active or not active) by controlling the voltage applied to the gates of PMOS transistors 310, 320. Similarly, the NMOS transistors 330, 340 coupled as shown form switchable conductive paths between the output node 350 and the second node 308, 309. This particular coupling arrangement enables a conductive path between output node 350 and the second node 308, 309 that can be switched on and off by controlling the voltage applied to the gates of NMOS transistors 330, 340. Also, it is noted that although the switchable conductive paths shown herein comprise a single MOS transistor between the output node and a first or second node, these switchable conductive paths can be implemented with a plurality of series connected circuit elements such as MOS transistors.

Typically, in a practical implementation the first node 305, 307 is a positive voltage supply and the second node 308, 309 is ground. The gates of PMOS transistor 310 and NMOS transistor 330 may be coupled in common to a preferably active-low, standby-high, pulsed signal source input A. The gates of PMOS transistor 320 and NMOS transistor 330 may be coupled in common to a preferably active-low, standby-high, pulsed signal source input B.

To obtain advantageous circuit output characteristics, the CMOS circuit 300 uses NMOS transistors 330, 340 that have threshold voltages ($V_t$) of zero or less. By setting the threshold voltage at these lower ranges, the NMOS transistors 330, 340 turn on more powerfully when active resulting in greater switching speed, lower noise when contending with PMOS transistors 310, 320 and increased gain and load capacity of the transistor pair (ratio) stage. Therefore, when a positive input voltage signal is applied to the gates (inputs) of NMOS transistors 330, 340, these two transistors become active (turn on) enabling a conductive path to ground. In an embodiment, the present invention may use ion implantation to effect the desired voltage threshold range.

Using zero or negative threshold voltages for the NMOS transistor, within a CMOS logic structure, as compared to more customary positive threshold voltages provides additional advantages in accordance with embodiments of the present invention The use of NMOS transistors having zero or negative threshold voltages as compared to NMOS transistor having positive threshold voltages enables the size of the NMOS transistors to be reduced while still maintaining the same output voltage at the output node when the PMOS and NMOS transistors are contending. When using NMOS transistors having positive threshold voltages within a CMOS logic structure, the NMOS transistors must be appropriately sized to pull-down the output node voltage to ground when a predetermined number of pull-up PMOS transistors are active to effectively implement particular digital logic functions (e.g., NOR). In comparison, NMOS transistors having zero or negative threshold voltages can be reduced in size since the use of zero or negative threshold voltages enables a sufficient standby leakage current (current across the NMOS transistor when no voltage is being applied) that provides additional assistance in pulling down the output node voltage to ground to implement particular digital logic functions. Also, NMOS transistors having zero or negative threshold voltages turn on more powerfully (e.g., greater current flow) which provides further assistance in pulling down the output node voltage to ground to implement particular digital logic functions.

The size reduction also lowers the NMOS transistor capacitance on the output node, due to the capacitance being proportional to transistor size, therein advantageously increasing the switching speed of the circuit for both pull-up and pull-down transitions. A further advantage, in accordance with embodiments of the present invention, provides increased gain of the ratio stage of the CMOS logic circuit which enables greater noise immunity while still maintaining a circuit switching speed comparable to positive threshold NMOS transistors.

Also, the use of NMOS transistors having zero or negative threshold voltages in the ratioed logic circuit invention described herein, as compared to static or domino circuits using such transistors, does not waste standby power in the CMOS logic circuit resulting from leakage current across the NMOS transistor. This reduction in wasteful power consumption is achieved because in the standby state there is zero voltage across the NMOS transistors, in accordance with embodiments of the present invention, when driven by preferably active-low, standby-high, pulsed signal sources. The advantageous use of active-low, standby-high, pulsed signal sources allows the full benefits of NMOS transistors having zero or negative threshold voltages to be realized without any significant disadvantages. Greater switching speed, greater noise immunity and other previously described advantages are realized using zero or negative threshold voltages. The potentially unfavorable condition created by the use of zero or negative threshold voltages, standby leakage current across the NMOS transistor, is greatly alleviated through the preferable use of active-low, standby-high, pulsed signal sources which help to minimize this leakage current and wasted power consumption. In contrast, traditional static or domino circuits in the standby state can have the full power supply voltage across most of the NMOS transistors since there is minimal leakage in the standby state since they require positive threshold voltages. The use of NMOS transistors having zero or negative threshold voltages in these traditional circuits results in wasteful power consumption due to the leakage current in the standby state. Since current is leaking from the NMOS transistor when no voltage is being applied (the standby state), a significant amount of power is consumed (wasted) during this state and the power consumption increases once a positive voltage is applied to the input.

The standby (no voltage being applied) leakage current of an NMOS transistor with a typical (positive) threshold voltage is in the range of 0.1 microamperes/micrometer of channel width. Thus an application device (e.g., transistor) with 10 million NMOS transistors of 1 micrometer channel width would have a standby leakage current, that is still acceptable, on the order of 1 ampere. However, NMOS transistors with zero or negative threshold voltages can have standby leakage currents in the range of 10 microamperes/micrometer of channel width. Therefore the use of NMOS transistors with zero or negative threshold voltages, in a CMOS logic structure in accordance with embodiments of the present invention, enables a very significant standby leakage current of 100 amperes. But even at this high level of NMOS standby leakage current, the CMOS circuit, in accordance with embodiments of the present invention, remains effectively functional since the PMOS transistor on-current is in the range of 300 microamperes/micrometer of channel width which is 30 times greater than the NMOS leakage current. The wasted power consumption within the CMOS logic structure, resulting from the greater NMOS transistor standby leakage current, is effectively countered by the greater on-current of the PMOS transistor which enables effective implementation of digital logic functions.

Thus, in direct contrast to static and domino logic designs of the prior art, the ratioed logic CMOS design, in accordance with embodiments of the present invention, enables selection of the advantageous zero or negative NMOS transistor threshold voltage independent of any potential concerns, caused by the use of zero or negative threshold voltages, regarding NMOS stand-by leakage and subsequent wasted standby power consumption. This technique is advantageously used in pre-determined critical paths of the application device (e.g., microprocessor) to enhance overall circuit performance (e.g., switching speed).

The zero or negative threshold voltage, in accordance with embodiments of the present invention, is advantageously provided using ion implantation. Ion implantation involves adjusting $V_t$ by implanting boron, phosphorus, or arsenic ions into the regions under the oxide of a MOS transistor. The implantation of boron causes a positive shift in $V_t$, while phosphorus or arsenic implantation causes a negative shift. It is further noted that other techniques may be used to effect the desired threshold voltage range including, but not limited to circuit design (ratio of PMOS-to-NMOS transistor channel widths—$W_p/W_n$) and process techniques.

Advantageously, CMOS circuit 300 performs the NOR digital logic function of inputs A, B. When any one of the preferably active-low, standby-high, pulsed input signals A, B are in a high state, the output node 350 is pulled down to a logical low level (0). Alternatively, when both of the active-low, standby-high, pulsed input signals are in a low state, the output node 350 is pulled to a logical high level (1).

This NORing function can be described with reference to FIG. 2. When any one of the active-low, standby-high, pulsed input signals, A, B is in a high state, the output node 350 is coupled to ground through one or both of the NMOS transistors 330, 340. One or both of the NMOS transistors 330, 340 becomes active (turned on) from the voltage applied by input signals A, B therein creating a connection to ground and pulling the voltage low at output node 350 (D). Although one of the PMOS transistors 310, 320 is active (when one input signal is high while the other remains low) therein creating a current flow through one of them, the NMOS transistors 330, 340 are sized (via respective PMOS-to-NMOS channel widths) such that any one of them can sink the current provided by the fully conducting (active) PMOS transistor 310, 320 thereby maintaining a predetermined nominal low level at output node 350.

Alternatively, when both the active-low, standby-high, pulsed signal sources A, B are in a low state, the output node 350 is pulled high because NMOS transistors 330, 340 are turned off thereby creating an open circuit between the output node 350 and ground. Since both PMOS transistors 310, 320 are turned on (fully conducting), the output node 350 is pulled high quickly.

In accordance with an embodiment, a DC current path to ground exists in circuit 300 when either one of the input signals A, B is low while the other remains high. Although typically circuit designers avoid using DC current paths, the present invention is operated with active-low, standby high pulses of the input signals having short time durations therefore quickly turning off the PMOS transistor path to the power supply ensuring a very short duration for the DC current path. The switching speed obtained from this logic structure is useful for high speed designs despite the extra active power consumed as compared with full static or domino CMOS logic structures.

Embodiments of the present invention provide several further advantages. In an embodiment of the CMOS circuit, the $W_p/W_n$ ratio can be selected enabling control of desired output voltage characteristics and noise margin. Noise margin can be increased by using a $W_p/W_n$ ratio of approximately 1:1.25 that will also lower the gain of the ratio stage by approximately 20% to 25% when not all inputs signals are high due to the increased gate overdrive of the NMOS transistors. This ratio also enables a smaller threshold voltage for the next stage. This ratio can also be combined with processing techniques to produced desired power, reliability, and leakage control characteristics of the logic structure. Alternatively, to increase the gain of the ratio stage, a $W_p/W_n$ ratio of 1:1 is used to increase the gain by approximately 20% to 30% which also decreases the noise margin of CMOS circuit while increasing the speed of the circuit. Processing techniques can be used to help combat the decrease in noise margin thereby maintaining reliability of the circuit. Embodiments of the present invention enable a readily scaleable gain of the ratio stage that maintains reliability and can be advantageously applied to computer microprocessors allowing increased speed and reduced power consumption.

Figure 3:
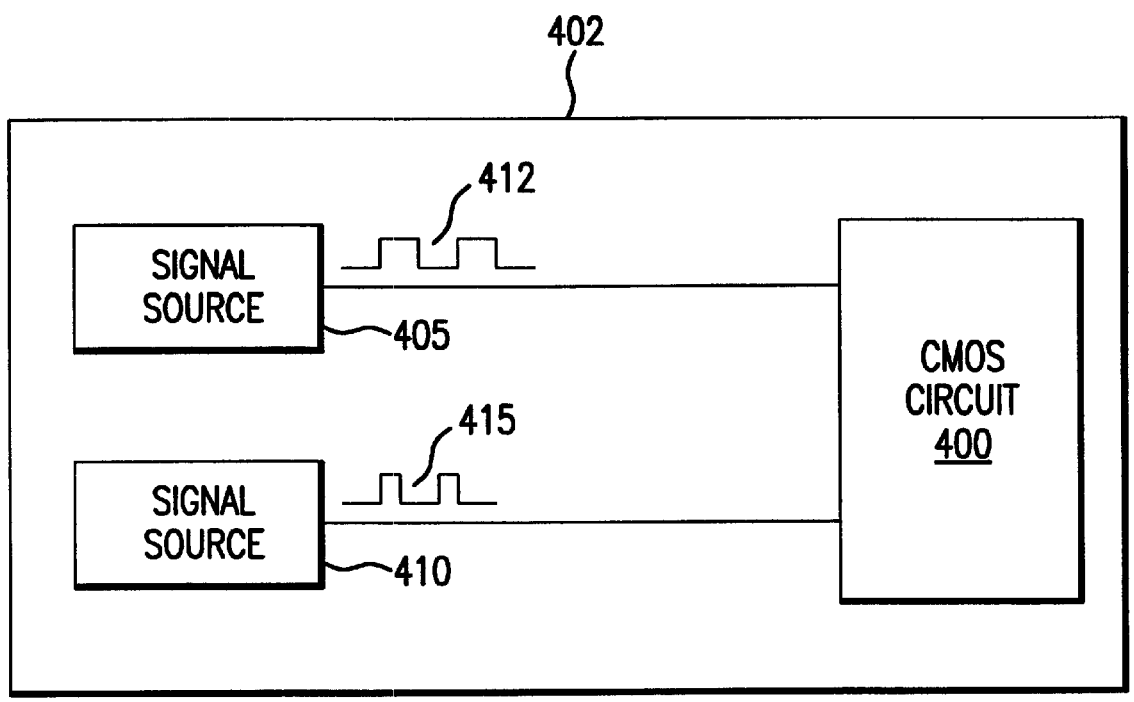
FIG. 3 is an illustrative alternative embodiment of the present invention showing a logic system on a circuit board.

As shown in FIG. 3, embodiments of the invention described herein may be implemented as logic system on a circuit board 402 wherein the CMOS circuit 400 is interconnected to a plurality of signal sources 405, 410. The signal sources 405, 410 advantageously provide the active-low, standby high, pulsed signal which acts as a clock input 412, 415 for the CMOS circuit 400. Clock input signals 412, 415 may be advantageously designed with pulse durations that make use of the zero or negative threshold voltage characteristics of the NMOS devices comprising the CMOS circuit 400. It is noted that the particular arrangement shown is exemplary and the invention is in no way limited to this particular embodiment as other embodiments may not include all the logic system components on one board or other pulse durations.

Additionally, embodiments of the present invention may be implemented as a microprocessor or multiprocessor system including a plurality of interconnected signal sources for effectively performing particular logic functions. Again, this system may be advantageously implemented on a circuit board using various system component arrangements. Embodiments may also include a computer system central processing unit advantageously implemented on a circuit board again using various system component arrangement.

Although embodiments of the invention are described herein using a particular CMOS logic structure, it will be appreciated by those skilled in the art that modifications and changes may be made without departing from the spirit and scope of the present invention. As such, the method and apparatus described herein may be equally applied to any similar CMOS logic structure utilizing NMOS transistor threshold voltages of zero or less. In addition, the method and apparatus described herein may be equally applied to CMOS logic structures complementary to those described in the present invention where the word NMOS is replaced by PMOS and all voltages and signal directions are inverted.

What is claimed is:

1. A circuit, comprising:
    a ratioed logic structure including a plurality of CMOS inverter stages, each made up of at least one PMOS device and at least one NMOS device, each of said NMOS devices having a threshold voltage of zero or less, each of said NMOS devices also having a leakage current, and each of said PMOS devices having an on-current greater than the sum of the leakage current of all NMOS devices in said plurality of CMOS inverter stages.

2. The circuit of claim 1, wherein each CMOS inverter stage includes an input for coupling to an active-low, standby high, pulsed signal source for controlling said leakage current.

3. The circuit of claim 1, wherein each CMOS inverter stage includes a channel width ratio for controlling at least one pre-determined circuit performance parameter.

4. The circuit of claim 1, wherein the circuit performance parameter includes either noise margin, gain of one of said plurality of CMOS inverter stages, or switching speed.

5. The circuit of claim 1, wherein:
   each of said plurality of CMOS inverter stages includes an output and an input for coupling to an active-low, standby high, pulsed signal source;
   wherein the output is caused to be either a digital "1" state or a digital "0" state in response to each signal source for performing a logical NOR function.

6. A method for constructing a ratioed logic structure including a plurality of CMOS inverter stages, each made up of at least one PMOS device and at least one NMOS device, comprising:
   forming each of said NMOS devices to have a threshold voltage of zero or less and a particular size, each of said NMOS devices also having a leakage current;
   forming each of said PMOS devices of a pre-determined size and threshold voltage, relative to the particular size and threshold voltage of each NMOS device, to have an on-current greater than the sum of the leakage current of all NMOS devices in said plurality of CMOS inverter stages.

7. The method of claim 6, wherein said step of forming each of said NMOS devices includes performing ion implantation to achieve the threshold voltage of zero or less.

8. The method of claim 6, wherein said step of performing includes implanting one of boron, phosphorus, and arsenic ions.

9. A method of implementing a ratioed logic structure including a plurality of CMOS inverter stages, each made up of at least one PMOS device and at least one NMOS device, comprising:
   forming each of said NMOS devices to have a threshold voltage of zero or less and a particular size, each of said NMOS devices also having a leakage current;
   forming each of said PMOS devices of a predetermined size and threshold voltage, relative to the particular size and threshold voltage of each NMOS device, to have an on-current greater than the sum of the leakage current of all NMOS devices in said plurality of CMOS inverter stages; and
   wherein said step of forming each said NMOS device includes forming an input in each CMOS inverter stage for controlling said leakage current and coupling to an active-low, standby high, pulsed signal source.

10. The method of claim 9, wherein said step of forming each said PMOS device includes forming a channel width ratio in each CMOS inverter stage for controlling at least one pre-determined circuit performance parameter.

11. The method of claim 10, wherein said circuit performance parameter is either noise margin, gain of one of said plurality of CMOS inverter stages, or switching speed.

12. The method of claim 9, wherein said step of forming each said PMOS device includes forming an output for outputting a digital "1" state or a digital "0" state in response to said input coupled to an active-low, standby high, pulsed signal source.

13. A system using a logic circuit, comprising:
   a plurality of signal sources; and
   a ratioed logic structure interconnected to at least one of said plurality of signal sources for providing an input signal to said ratioed logic structure, said ratioed logic structure including a plurality of CMOS inverter stages, each made up of at least one PMOS device and at least one NMOS device, each of said NMOS devices having a threshold voltage of zero or less, each of said NMOS devices also having a leakage current, and each of said PMOS devices having an on-current greater than the sum of the leakage current of all NMOS devices in said plurality of CMOS inverter stages.

14. The system of claim 13, wherein said plurality of signal sources include an active-low, standby high, pulsed signal source for inputting a clock signal for said plurality of CMOS inverter stages and controlling said leakage current.

15. The system of claim 13, wherein at least one of said plurality of signal sources and said ratioed logic structure are positioned on a circuit board.

16. A microprocessor, comprising:
   a plurality of ratioed logic structures, each including a plurality of CMOS inverter stages, each CMOS inverter stage made up of at least one PMOS device and at least one NMOS device, each of said NMOS devices having a threshold voltage of zero or less, each of said NMOS devices also having a leakage current, and each of said PMOS devices having an on-current greater than the sum of the leakage current of all NMOS devices in said plurality of CMOS inverter stages.

17. A microprocessor system, comprising:
   a plurality of signal sources; and
   at least one microprocessor interconnected to at least one of said plurality of signal sources for providing an input signal to said microprocessor, each microprocessor made up of a plurality of ratioed logic structures, each ratioed logic structure including a plurality of CMOS inverter stages, each CMOS inverter stage made up of at least one PMOS device and at least one NMOS device, each of said NMOS devices having a threshold voltage of zero or less, each of said NMOS devices also having a leakage current, and each of said PMOS devices having an on-current greater than the sum of the leakage current of all NMOS devices in said plurality of CMOS inverter stages.

18. The system of claim 17, wherein at least one of said plurality of signal sources and said microprocessor are positioned on a circuit board.

19. A computer system including a central processing unit, comprising:
   a plurality of signal sources; and
   at least one microprocessor interconnected to at least one of said plurality of signal sources, each made up of a plurality of ratioed logic structures, each ratioed logic structure including a plurality of CMOS inverter stages, each CMOS inverter stage made up of at least one PMOS device and at least one NMOS device, each of said NMOS devices having a threshold voltage of zero or less, each of said NMOS devices also having a leakage current, and each of said PMOS devices having an on-current greater than the sum of the leakage current of all NMOS devices in said plurality of CMOS inverter stages.

20. The computer system of claim 19, wherein at least one of said plurality of signal sources and said microprocessor are positioned on a circuit board.

* * * * *